(12) United States Patent
Horvath (10) Patent No.: US 8,912,785 B2
(45) Date of Patent: Dec. 16, 2014

(54) LOW-POWER RF PEAK DETECTOR

(75) Inventor: Andras Vince Horvath, Hungary (HU)

(73) Assignee: Silicon Laboratories Inc., Austin, TX (US)

( * ) Notice: Subject to any disclaimer, the term of this patent is extended or adjusted under 35 U.S.C. 154(b) by 296 days.

(21) Appl. No.: 13/249,187

(22) Filed: Sep. 29, 2011

(65) Prior Publication Data

US 2013/0082688 A1    Apr. 4, 2013

(51) Int. Cl.
*G01R 19/04*    (2006.01)
*G01R 21/01*    (2006.01)

(52) U.S. Cl.
CPC ..................... *G01R 21/01* (2013.01)
USPC ................. 324/103 P; 324/120; 324/140 R; 324/98; 327/357; 327/359

(58) Field of Classification Search
USPC .......... 324/26.11, 120, 103 R, 103 P, 98, 130, 324/140 R
See application file for complete search history.

(56) References Cited

U.S. PATENT DOCUMENTS

| | | | |
|---|---|---|---|
| 4,764,892 A | 8/1988 | Thomas | |
| 5,521,544 A * | 5/1996 | Hatanaka | 327/356 |
| 5,656,964 A | 8/1997 | Liu | |
| 5,825,231 A * | 10/1998 | Chevallier et al. | 327/356 |
| 6,255,889 B1 | 7/2001 | Branson | |
| 7,091,713 B2 * | 8/2006 | Erdelyi et al. | 323/314 |
| 2001/0033192 A1 | 10/2001 | Knierim et al. | |
| 2005/0130619 A1 * | 6/2005 | Hanke et al. | 455/326 |
| 2005/0265480 A1 * | 12/2005 | Dornbusch | 375/308 |
| 2006/0222115 A1 | 10/2006 | Dornbusch et al. | |
| 2010/0264984 A1 * | 10/2010 | Gomez et al. | 330/124 R |
| 2011/0102047 A1 | 5/2011 | Sun et al. | |

* cited by examiner

*Primary Examiner* — Vinh Nguyen
*Assistant Examiner* — Dustin Dickinson
(74) *Attorney, Agent, or Firm* — Meyertons, Hood, Kivlin, Kowert & Goetzel, P.C.; Paul T. Seegers (57) ABSTRACT

Techniques are disclosed relating to radio frequency (RF) power detection. In one embodiment, a power detection circuit includes a multiplier circuit configured to multiply a first voltage signal by a second voltage signal. The multiplier circuit receives the first voltage signal at gates of a first transistor pair and receives the second voltage signal at gates of second and third transistor pairs. In some embodiments, a drain of a first transistor in the first transistor pair is coupled to sources of the second transistor pair, and drain of a second transistor in the first transistor pair is coupled to sources of the third transistor pair. In some embodiments, the power detection circuit includes a comparison circuit that compares the first pair of currents and a second pair of currents associated with a threshold voltage signal.

17 Claims, 9 Drawing Sheets

LOW-POWER RF PEAK DETECTOR

BACKGROUND

1. Technical Field

This disclosure relates generally to radio-frequency (RF) circuits, and, more specifically, to RF power detection.

2. Description of the Related Art

RF circuits typically perform a variety of operations to process a received signal. Such operations may include filtering the signal, demodulating it, sampling it, etc. In order to perform some of these operations, various circuits in the receiver chain may require that the RF signal have a signal strength within a particular range (e.g., a range of 60-80 dB). Often, however, an RF signal is too weak by the time it arrives at the receiver. To account for this, the receiver may attempt to amplify the signal before processing it further.

In many instances, RF circuits employ a feedback loop in which an incoming signal passes through an amplifier and then a power detector, which measures its power. If the signal strength is too high or too low, the RF circuit adjusts the gain of amplifier accordingly. This form of feedback loop is commonly referred to as an automatic gain control (AGC) system.

SUMMARY OF EMBODIMENTS

The present disclosure describes techniques for improving radio frequency (RF) power detection.

In one embodiment, a power detection circuit is disclosed. The power detection circuit includes a multiplier circuit configured to multiply a first voltage signal by a second voltage signal. The multiplier circuit is configured to receive the first voltage signal at a first transistor pair and to receive the second voltage signal at second and third transistor pairs.

In another embodiment, an apparatus is disclosed that includes a multiplier circuit. The multiplier circuit includes first, second, and third FET pairs. The multiplier is configured to receive a first voltage signal at gates of the first FET pair, and to receive a second voltage signal at gates of the second and third FET pairs. The first multiplier circuit is configured operate the first, second, and third FET pairs in a linear region of operation.

In yet another embodiment, a method is disclosed. The method includes multiplying first and second voltage differential signals received at respective gates of first and second sets of FETs of a multiplier circuit. The first and second voltage differential signals cause FETs in the first and second sets of FETs to operate in a linear region of operation. The method further includes comparing a first pair of currents output by the multiplier circuit with a second pair of currents corresponding to a threshold voltage differential signal. The method further includes adjusting a gain of an amplifier based on the comparing.

This specification includes references to "one embodiment," "the illustrated embodiment," "in some embodiments," and "in various embodiments." The appearances of these phrases do not necessarily refer to the same embodiment. Particular features, structures, or characteristics may be combined in any suitable manner consistent with this disclosure.

DETAILED DESCRIPTION

Figure 1:
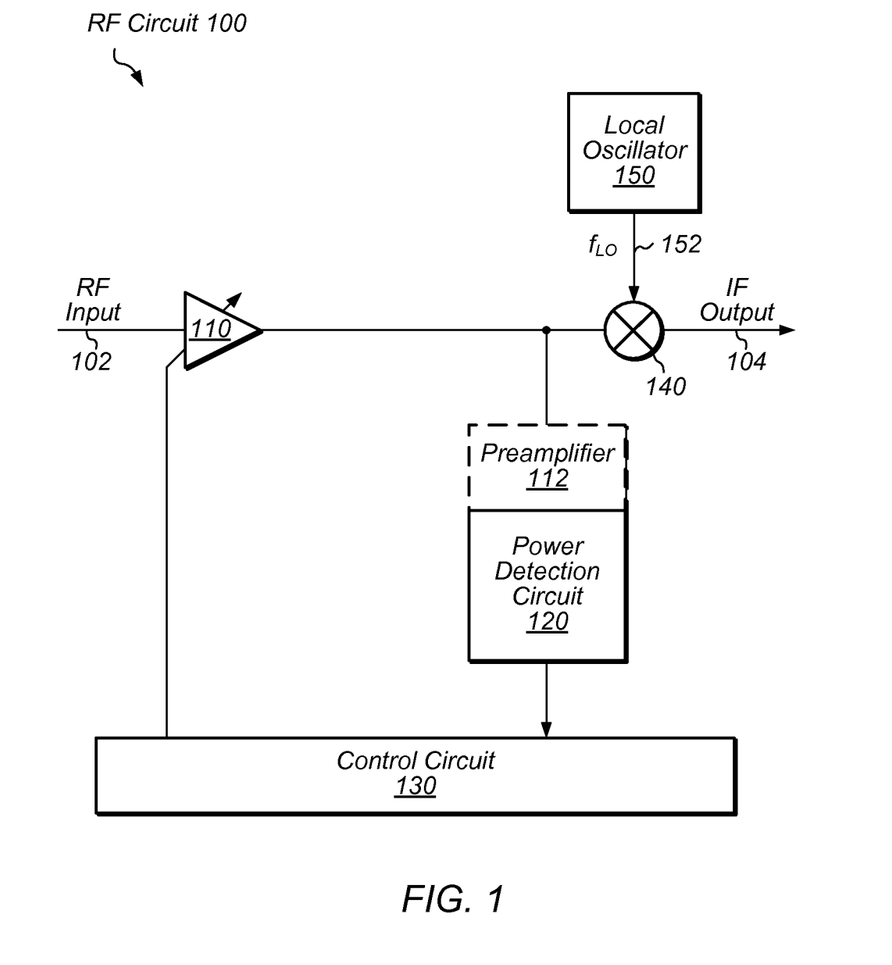
FIG. 1 is a block diagram illustrating one embodiment of an RF circuit configured to amplify a received RF signal based on its power.

Turning now to FIG. 1, a block diagram of an RF circuit 100 is depicted. RF circuit 100 in one embodiment of a circuit that is configured to amplify a received RF input signal 102 based on its strength (i.e., power). In the illustrated embodiment, RF circuit 100 includes an adjustable amplifier 110, a power detection circuit 120, and a control circuit 130. RF circuit 100 may be used in various applications such as television receivers, cellular phones, modems, network devices, satellite radios, etc. In some embodiments, RF circuit 100 may be used in wireless devices; in other embodiments, RF circuit 100 may be used in wired devices. In short, RF circuit 100 may be used in any suitable application.

In the illustrated embodiment, RF circuit 100 provides an incoming RF signal 102 to adjustable amplifier 110 to produce an amplified output signal. In one embodiment, power detection circuit 120 measures the power of the amplified signal and indicates the result to control circuit 130. Control circuit 130 (which may be implement using a microcontroller, in some embodiments) is configured to then adjust the gain of amplifier 110 so that the amplified output signal falls within a desired range for circuit 100. In other words, control circuit 130 may increase or decrease the gain of amplifier 110 depending on whether the amplified signal is too strong or too weak, respectively. The amplified output signal may then be provided to additional circuitry in a receiver chain for further processing such as a mixer 140, which, in the illustrated embodiment, receives a low-frequency signal 152 from a local oscillator 150 to produce an intermediate frequency (IF) output 104.

In one embodiment, power detection circuit 120 is configured to measure the power of the amplified RF input signal 102 by performing a squaring operation (since the power of a signal varies proportional to the square of the signal's voltage). Power detection circuit 120 may then compare the power of signal 102 with one or more thresholds (e.g., for upper and lower bounds of desired range) and indicate the result(s) to control circuit 130. In order for power detection circuit 120 to operate correctly, the RF signal amplified by amplifier 110 may need to be further amplified using a preamplifier 112 (e.g., a fixed-gain amplifier), in some embodiments, to produce a large enough input signal (e.g., more than 100 mV). Producing this larger input signal and processing it in such a detector can consume a considerable amount of current (e.g., more than 1 mA, in some instances). This can be problematic for applications in which power is limited such as in battery-operated devices.

As will be described below, in other embodiments, however, power detection circuit 120 may employ various techniques that permit it to operate with smaller input signals (e.g., signals less than 25 mV, in one embodiment) without using a preamplifier such as preamplifier 112. In such embodiments, power detection circuit 120 may consume considerably less current than other detectors (e.g., in one embodiment, circuit 120 may consume less than 100 μA). Power detection circuit 120 may also be more compact physically—for example, it may occupy less die area.

It is noted that, although power detection circuit 120 is described within the context of gain adjustment, power detection circuit 120 may be used in applications other than gain adjustment. Similarly, multiplier 210 (described below) may also be used in applications other than power detection in some embodiments.

Figure 2:
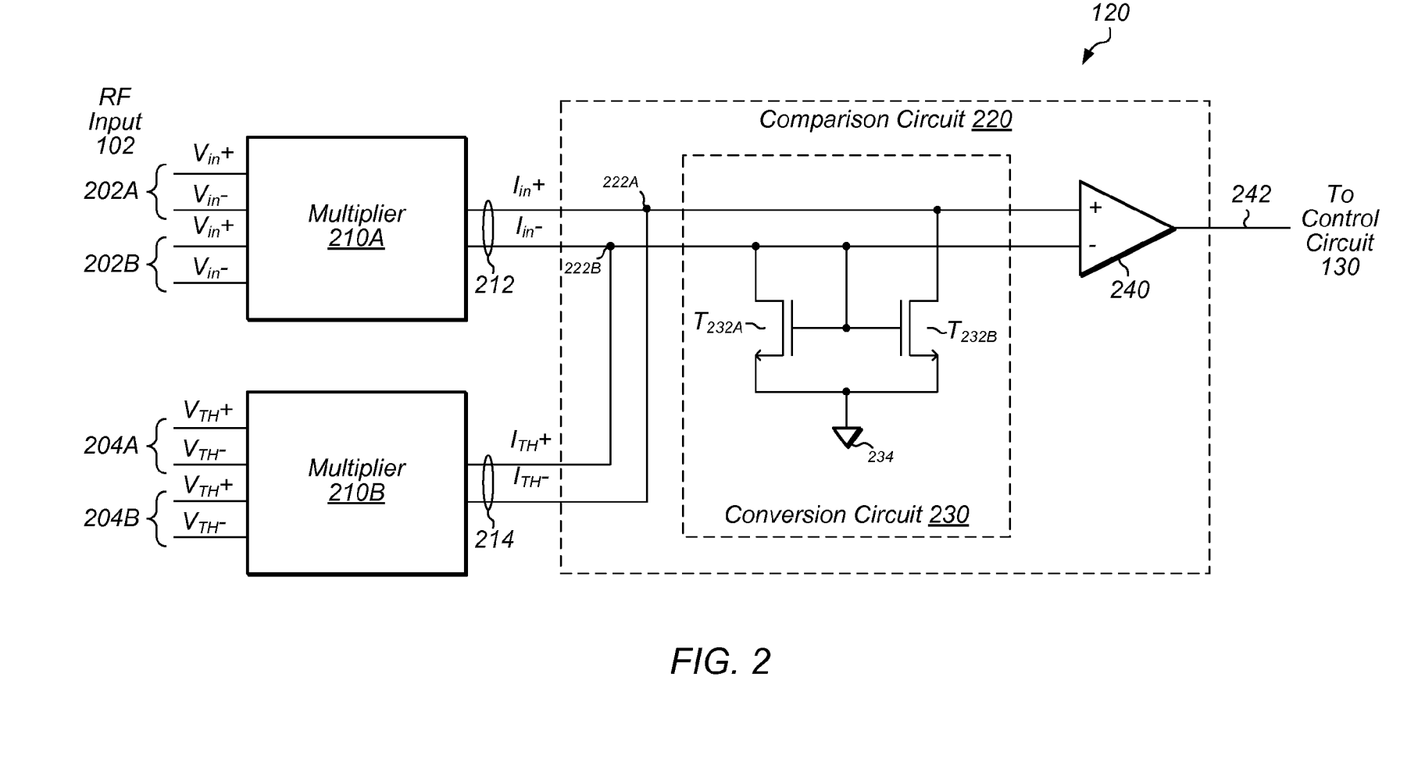
FIG. 2 is a block diagram illustrating one embodiment of a power detection circuit within the RF circuit.

Turning now to FIG. 2, one embodiment of power detection circuit 120 is depicted. As discussed above, in various embodiments, power detection circuit 120 may determine the power of a signal 102, by performing a square operation, and may compare the result with one or more thresholds. To this end, power detection circuit 120, in the illustrated embodiment, includes multipliers 210A and 210B and comparison circuit 220. In some embodiments, power detection circuit 120 may also include additional multipliers 210 and/or comparison circuits 220.

Multiplier 210A, in one embodiment, is configured to operate as a squarer to determine the power of RF signal 102. In the illustrated embodiment, multiplier 210A receives RF signal 102 as a voltage differential signal (a signal represented by the difference in voltages between lines $V_{in}^+$ and $V_{in}^-$) supplied to both inputs of multiplier 210A as signals 202A and 202B. Multiplier 210A produces a corresponding current differential signal 212 (a signal represented by the difference in current between lines $I_{in}^+$ and $I_{in}^-$) that varies proportional to the multiplication of signals 202A and 202B—in other word, $I_{in}^+ - I_{in}^- \approx (V_{in}^+ - V_{in}^-)^2$. Thus, multiplier may be said to operate as a "squarer" by "multiplying" voltage differential signals 202A and 202B. In one embodiment, multiplier 210A is configured to low-pass filter the current differential signal prior to providing it as signal 212 to comparison circuit 220, so that signal 212 is indicative of the peak power of RF signal 102.

Multiplier 210B, in one embodiment, is configured to generate a reference signal (i.e., threshold signal) for comparison with the signal produced by multiplier 210A. In the illustrated embodiment, multiplier 210B receives a differential threshold voltage signal, which is supplied to both inputs of multiplier 210B as signals 204A and 204B. Multiplier 210B produces a corresponding current differential signal 214 that various proportionally to the square of the differential threshold voltage signal—i.e., $I_{TH}^+ - I_{TH}^- \approx (V_{TH}^+ - V_{TH}^-)^2$. In various embodiments, signal 204 may correspond to the boundary of a desired range for RF signal 102. For example, if output signal 104 needs to have a magnitude of at least 10 mV, a 10 mV differential signal may be provided as signal 204 so that the power of signal 204 can be used as a reference in a comparison (by comparison circuit 220 described below) with the power of signal 102. Signal 102 may then be amplified if its power is less than signal 204's power.

As will be described in further detail below in conjunction with FIG. 3, in various embodiments, multipliers 210 may be implemented using a four-quadrant multiplier that is configured to operate with low-power input signals.

Comparison circuit 220, in one embodiment, is configured to compare signals 212 and 214 and generate a corresponding output signal for control circuit 130. In the illustrated embodiment, comparison circuit 220 couples the lines supplying currents $I_{in}^+$ and $I_{TH}^-$ at node 222A and the lines supplying currents $I_{in}^-$ and $I_{TH}^+$ at node 222B. The currents at nodes 222 are supplied to a current-to-voltage conversion circuit 230, which is implemented using a current minor, in the illustrated embodiment. As the currents from nodes 222A and 222B pass respectively through transistors 232A and 232B (shown in the exemplary embodiment as N-type metal-oxide-semiconductor field-effect transistors (MOSFETs), in the illustrated embodiment) to a ground reference 234, conversion circuit 230 raises the voltages at nodes 222A and 222B proportional to the received currents. Voltage comparator 240 is configured to compare the voltages at nodes 222A and 222B and generate a corresponding output signal 242 for control circuit 130. For example, comparator 240 may output a voltage representative of a logical one if node 222A has a higher voltage than node 222B, and may output a voltage representative of a logical zero otherwise. Thus, the output of comparator 240 is high when the effective value of the power detector input signal (RF signal 102) exceeds the direct-current (DC) level at the threshold input signals 204.

Figure 3:
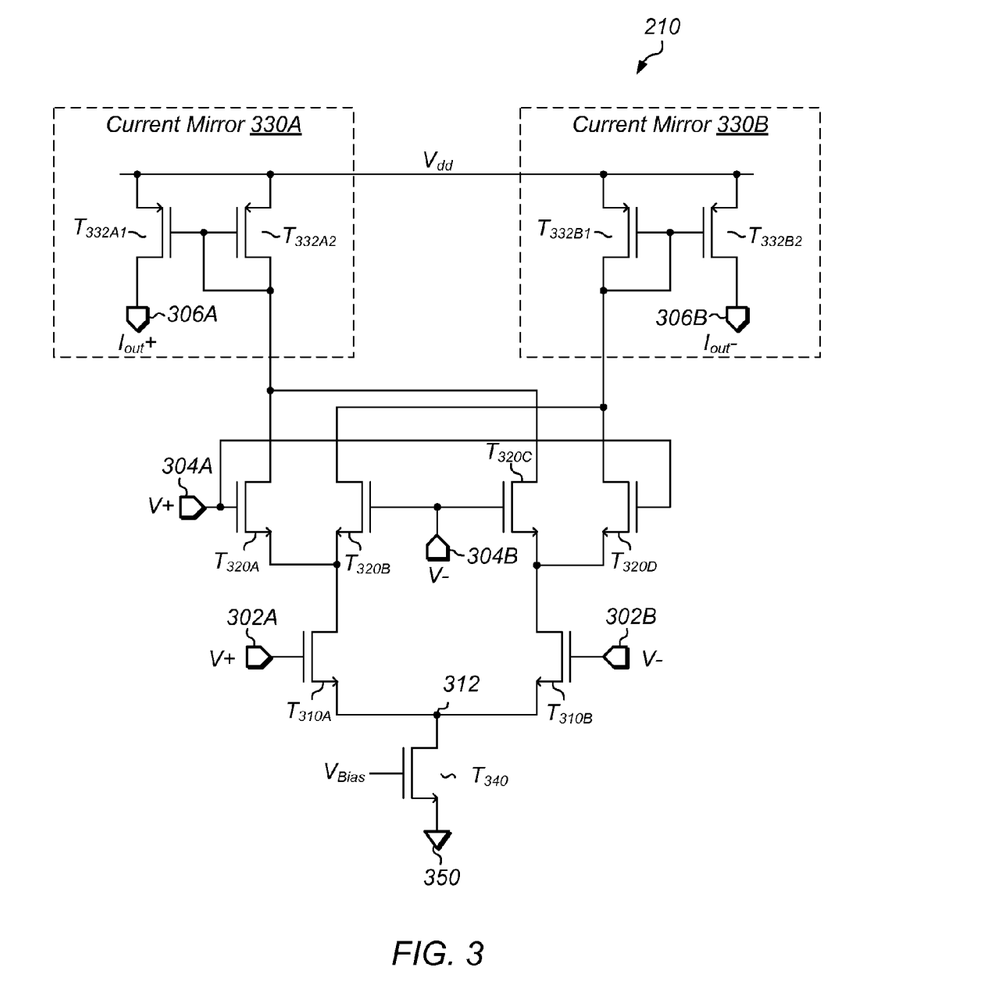
FIG. 3 is a block diagram illustrating one embodiment of a multiplier circuit within the power detection circuit.

Turning now to FIG. 3, one embodiment of a multiplier 210 is depicted. In the illustrated embodiment, multiplier 210 receives a first voltage differential signal (e.g., one of signals 202 or 204) at nodes 302A and 302B coupled to gates of a first pair of transistors 310A and 310B. Multiplier 210 receives a second voltage differential signal (e.g., one of signals 202 or 204) at nodes 304A and 304B coupled to gates of a second pair of transistors 320A and 320B and a third pair of transistors 320C and 320D. In some embodiments, transistors 310 and 320 are smaller N-type MOSFETs that have small parasitic capacitances and good RF behavior. As shown, the drain of transistor 310A is coupled to sources of transistors 320A and 320B, the drain of transistor 310B is coupled to the sources of transistors 320C and 320D, and the sources of transistors 310A and 310B share a common node 312. Node 312 is coupled to a bias transistor 340, which is coupled to a ground reference 350 and sets the operation point for circuit 210 (in some embodiments, transistor 340 may be part of a current source or replaced by a current source). Transistors 320A and 320C are coupled to a current minor 330A, which includes transistors 332A1 and 332A2. Transistors 320B and 320D are coupled to a current minor 330B, which includes transistors transistor 332B1 and 332B2. In some embodiments, transistors 332 and 350 are larger P-type MOSFETs having good matching and high capacitances (and thus operating as low-pass filters). The sources of transistors 332 are coupled to a voltage source $V_{dd}$. Multiplier 210 is configured to output the current differential signal (shown as $I_{out}^+$ and $I_{out}^-$, which may correspond to, for example, signals 212 or 214) at nodes 306A and 306B.

In the illustrated embodiment, multiplier 210 is 4-quadrant multiplier used to generate an output signal proportional to the power of the input signal based on the formula: $\sin^2(x) = \frac{1}{2} - \frac{1}{2}\cos(2x)$. As input signals are applied to nodes 302 and 304, transistors 310 and 320 pull currents from current mirrors 330 to perform a squaring of the sinusoid signal. This squaring produces an output signal including a DC component and an alternating-current (AC) component $\frac{1}{2} - \frac{1}{2}\cos(2x)$. The DC component is proportional to the power of the input sinusoid signal, while the AC component is low-pass filtered via capacitors. In some embodiments, the filter capacitors may be parasitic capacitors of transistors 332 in mirrors 330. In some instances, this filtering is possible because of the high-frequency of the AC component. Thus, multiplier 210 may produce a DC signal at nodes 306 proportional to the power of the input RF signal at nodes 302 and 304.

As discussed above, in some embodiments, multiplier 210 is configured to operate with small input signals (e.g., signals of less than 25 mV, in one embodiment). This is possible because transistors 310 and 320 operate in the linearly region (i.e., when drain-to-source voltage is less than the gate-to-source voltage minus the threshold voltage ($V_{DS} < (V_{GS} - V_{th})$) and the gate-to-source voltage is greater than the threshold voltage ($V_{GS} > V_{th}$)). Operating in this region allows smaller input signals to be used than if transistors 310 and 320 operated in the saturation region (i.e., $V_{DS} > (V_{GS} - V_{th})$). Thus, in some embodiments, RF circuit 100 does not need to perform any form of amplification of RF signal 102 (e.g., by employing a preamplifier) beforehand, which reduces power consumption.

Figure 6A:
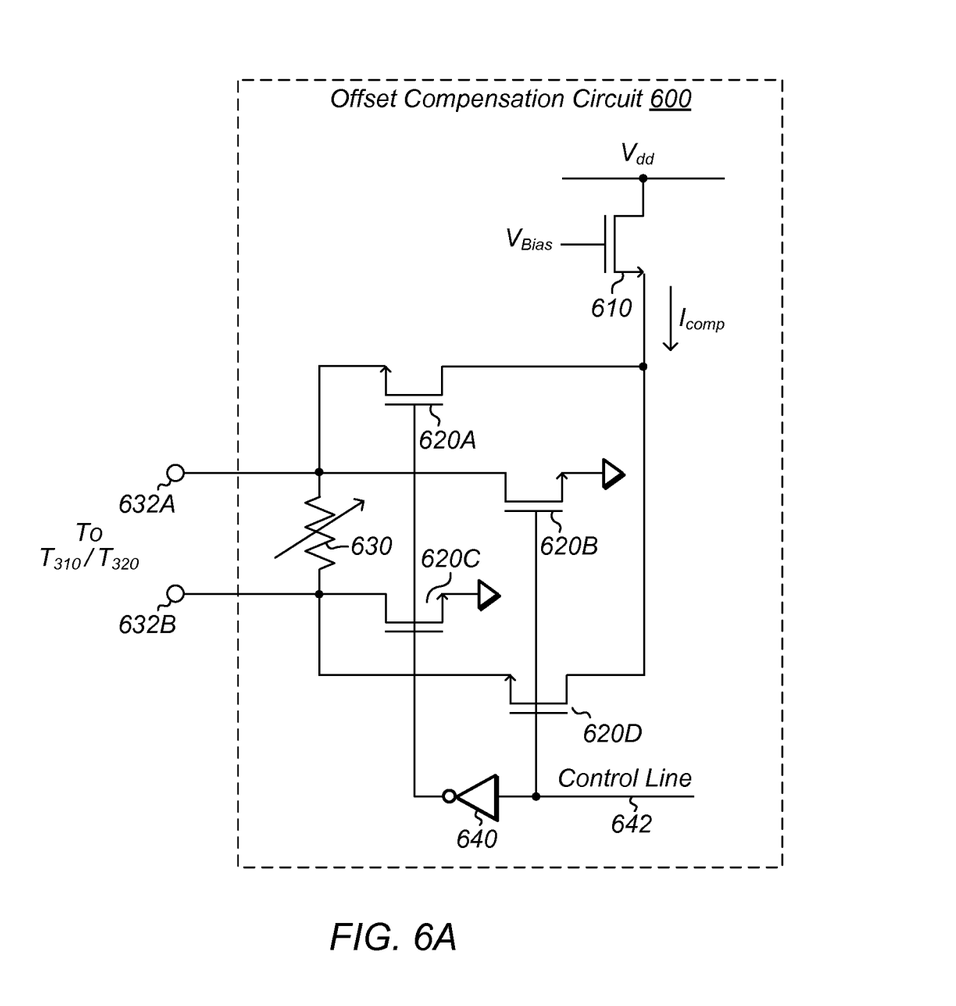
FIG. 6A is a block diagram illustrating one embodiment of an offset compensation circuit.

In some instances, the mismatching of transistors 310 and 320 can produce undesired offsets. Mismatching can occur as smaller transistors may be used, in some embodiments, for transistors 310 and 320 because they have less parasitic capacitance and thus better RF performance. The offsets produced by mismatching, however, can be as high as the RF input signal amplitude, in some instances (e.g., 10 mV or more), which can severely impair the operation of power detection circuit 210. In one embodiment, an offset produced by the mismatching of transistors 310 may be compensated for by adding an offset voltage to input nodes 302. For the situation where transistors 310 have cross-coupled drains, other offset techniques may be used. As will be described below in conjunction with FIG. 6, in another embodiment, an offset compensation circuit is configured to apply voltages to the bodies of transistors 310 and 320 to reduce such offsets. This approach splits the RF input signal from the offset compensation circuit by not compensating on the front (gate) side, but rather on the back (body/bulk) side. By applying voltages their bodies, mismatches of transistors 310 (or 310 and 320) can be compensate for as well.

Figure 4:
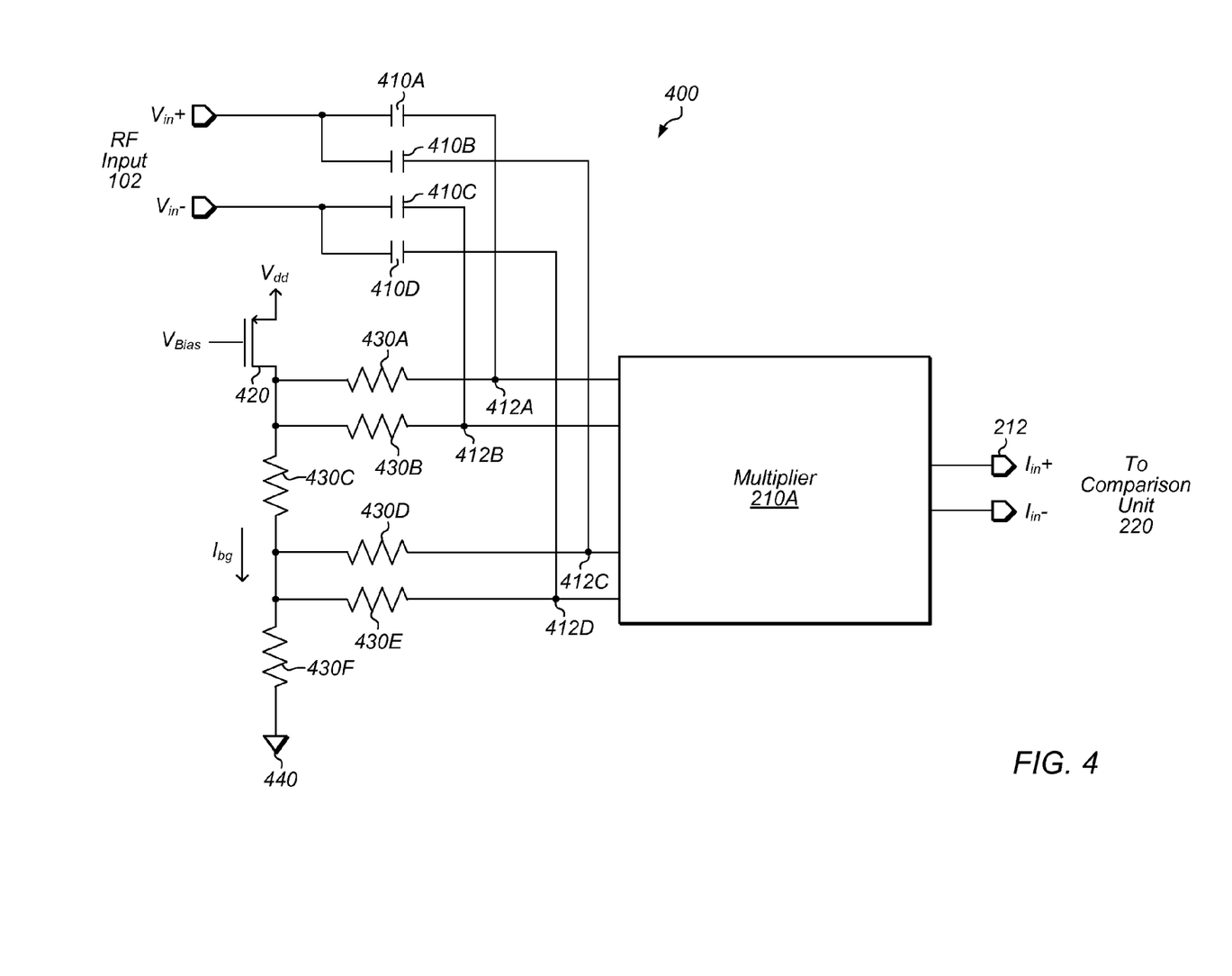
FIG. 4 is a block diagram illustrating one embodiment of input circuitry for a multiplier circuit receiving an RF input signal.

Turning now to FIG. 4, a block diagram of input circuitry 400 for multiplier 210A is depicted. Input circuitry 400 is one embodiment of circuitry configured to process RF input signal 102 for input into multiplier 210A. As shown, circuitry 400 includes capacitors 410A-D, transistor 420, and resistors 430A-F. In the illustrated embodiment, circuit 400 process RF signal 102 by initially passing it through capacitors 410A-D to high-pass filter it separating its alternating current (AC) component from its DC component. Input circuitry 400 supplies the DC components at nodes 412 by using transistor 420 and resistors 430A-F. To generate the DC components, a voltage $V_{Bias}$ is applied to the gate of transistor 420 to produce a band-gap current $I_{bg}$. As the current passes through resistor 430C, it raises the voltage at nodes 412A and 412B relative to the voltage at nodes 412C and 412D (e.g., by 500 mV, in one embodiment, due to the stacked nature of transistors 310 and 320). The current passing through resistor 430F further raises the voltage at nodes 412 relative to ground reference 440. Resistors 430A, 430B, 430D, and 430E, in one embodiment, have the same resistance so that nodes 412A and 412B have same DC voltage potential and nodes 412C and 412D have the same DC voltage potential.

Figure 5:
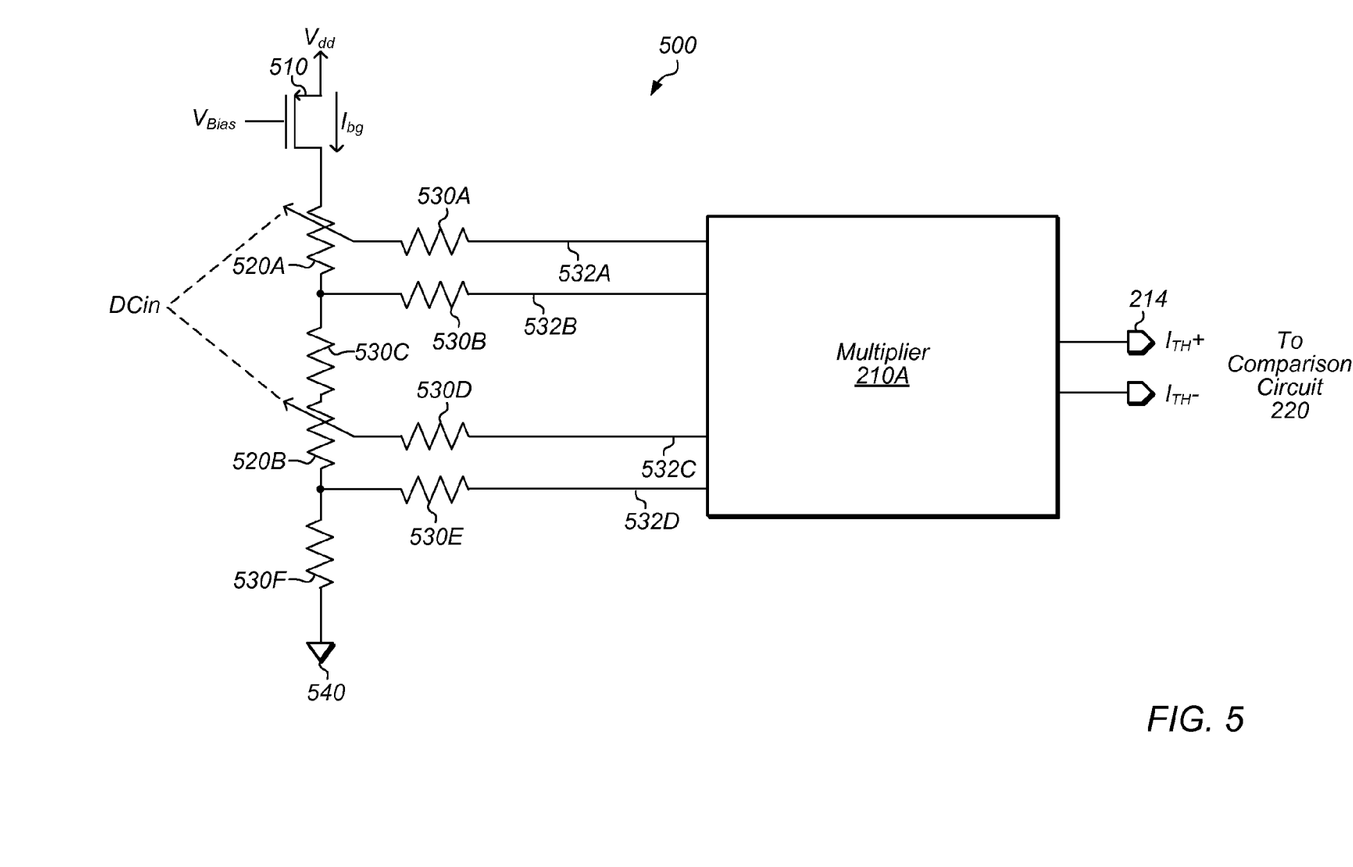
FIG. 5 is a block diagram illustrating one embodiment of input circuitry for a multiplier circuit receiving a threshold-voltage input signal.

Turning now to FIG. 5, a block diagram of input circuitry 500 for multiplier 210B is depicted. Input circuitry 500 is one embodiment of circuitry configured to generate a differential threshold voltage signal for multiplier 210B. As shown, circuit 500 includes transistor 510, variable resistors 520A and 520B, resistors 530A-F. In the illustrated embodiment, circuitry 500 produces signals on lines 532 by applying a voltage $V_{Bias}$ to the gate of transistor 510, which produces a band-gap current $I_{bg}$. As the current passes through resistors 520 and 530, corresponding voltages are produced on lines 532. Circuitry 500 controls the voltage differentials on lines 532A and 532B and on lines 532C and 532D by varying the resistance of resistors 520A and 520B, respectively. In various embodiments, resistors 520A and 520B are adjusted by the same amount so that the voltage differential on lines 532A and 532B is the same as the voltage differential on lines 532C and 532D.

Turning now to FIG. 6A, a block diagram of an offset compensation circuit 600 is depicted. As discussed above, in some instances, transistors 310 and 320 may be mismatched (e.g., due to imperfections in fabrication, semiconductor impurities), which produces undesired offsets. Offset compensation circuit 600 is one embodiment of a circuit configured to reduce such offsets.

In the illustrated embodiment, offset compensation circuit 600 compensates for offsets by applying offset voltages via output nodes 632A and 632B to the bodies of transistors 310 or 320 to change their respective threshold voltages. Offset compensation circuit 600 produces the offset voltages by applying a voltage $V_{Bias}$ at the gate of transistor 610 to produce a current $I_{comp}$ and passing the current through variable transistor 630. Offset compensation circuit 600 controls the direction of $I_{comp}$ through resistor 630 by controlling the switching of transistors 620 (via control line 642, which passes through inventor 640, in the illustrated embodiment). Offset compensation circuit 600 controls the magnitude of the offset voltage by varying the resistance of resistor 630.

In many instances, the manner in which circuit 600 compensates for offsets can be much more accurate than applying an offset to the gates of transistors 310/320 because the differential body voltage may be significantly higher than the offset. For example, in one embodiment, a 4 mV voltage may be applied to produce a 500 µV offset compensation for a transistor pair 310/320. Also, mixing band-gap and proportional-to-absolute-temperature (PTAT) currents in $I_{comp}$, in one embodiment, adds a temperature slope to the offset compensation, which meets the temperature characteristic of the offset voltages. In this way, power detection circuit 120 is able to operate in a wider temperature range without re-calibration.

Figure 6B:
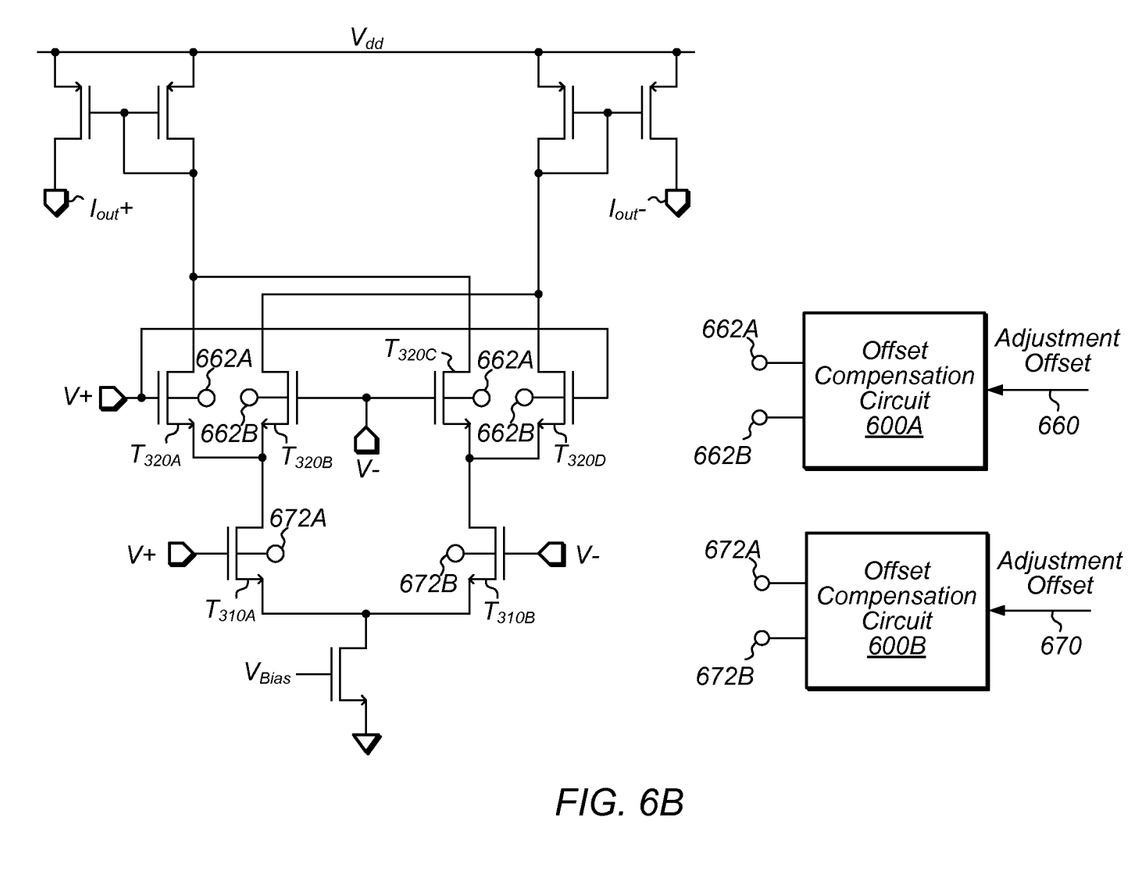
FIG. 6B is a block diagram illustrating one embodiment of the coupling of a pair of offset compensation circuits to a multiplier circuit.

Turning now to FIG. 6B, one embodiment of the coupling of a pair of offset compensation circuits 600A and 600B to a multiplier circuit 210 is depicted. As shown, offset compensation circuit 600A provides an offset voltage via nodes 662A and 662B to transistors 320 based on an adjustment offset 660. Offset compensation circuit 600B provides another offset voltage via nodes 672A and 672B to transistors 310 based on an adjustment offset 670. As discussed above, in one embodiment, adjustment offsets 660 and 670 may be selected to change the resistances of variable resistors in circuits 600 to reduce noise introduced by transistors 310 and 320.

Figure 7:
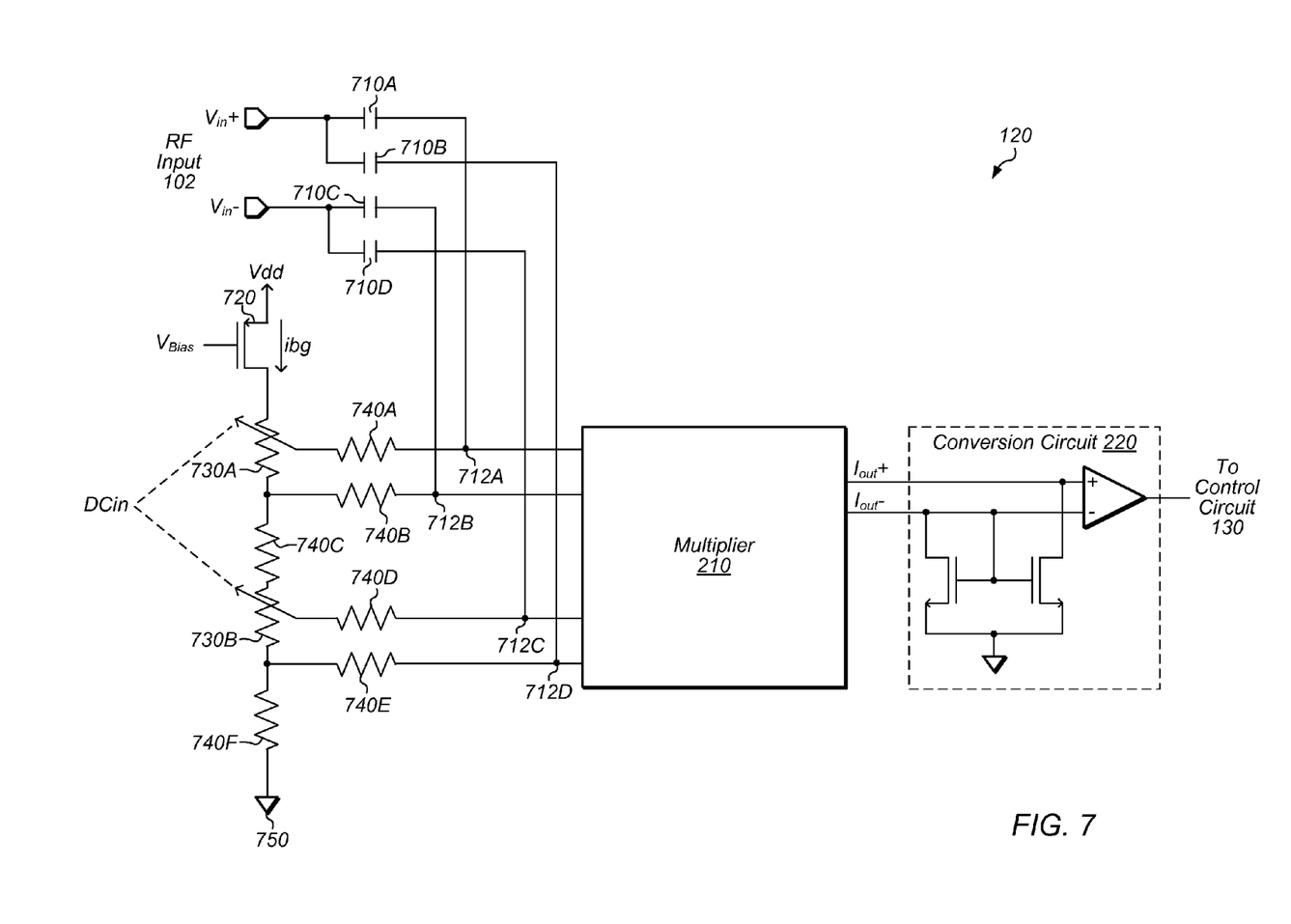
FIG. 7 is a block diagram illustrating one embodiment of a power detection circuit with a single multiplier circuit.

Turning now to FIG. 7, another embodiment of power detection circuit 120 that includes a single multiplier 210 that receives both RF input 102 and the threshold voltage differential signal is depicted. In the illustrated embodiment, the threshold differential signal is generated using transistor 720, variable resistors 730A and 730B, resistors 740A-F, and ground reference 750 in a similar manner as circuit 500 described above.

This signal is then supplied to nodes 712A-D as the input DC component for multiplier 210. RF input signal 102, which forms the AC input component, passes through capacitors 710A-D to nodes 712A-D. Unlike circuit 400 in which $V_{in}^+$ passes to nodes 412A and 412C and $V_{in}^-$ passes to nodes 412B and 414D, $V_{in}^+$ passes to nodes 712A and 712D and $V_{in}^-$ passes to nodes 712B and 712C (thus inverting RF signal 102 at nodes 712C and D) in the illustrated embodiment. This causes the input at nodes 712A and 712B to be the DC component plus the AC component and the input at nodes 712C and 712D to be the DC component minus the AC component since the polarity is changed at nodes 712C and 712D. As a result, multiplier 210 produces the output: (DC+AC)*(DC−AC)=DC²−AC². Thus, in one embodiment, if the power of the threshold signal (the DC component) is greater than or equal to the power of the RF input signal 102 (the AC component), then $I_{out}^+$ is greater than or equal to $I_{out}^-$. If, however, the power of the threshold signal is less than the power of the RF input signal 102, $I_{out}^+$ is less than $I_{out}^-$. As discussed above, comparison circuit 220 may generate a corresponding output to control circuit 130 based on this relationship.

Figure 8:
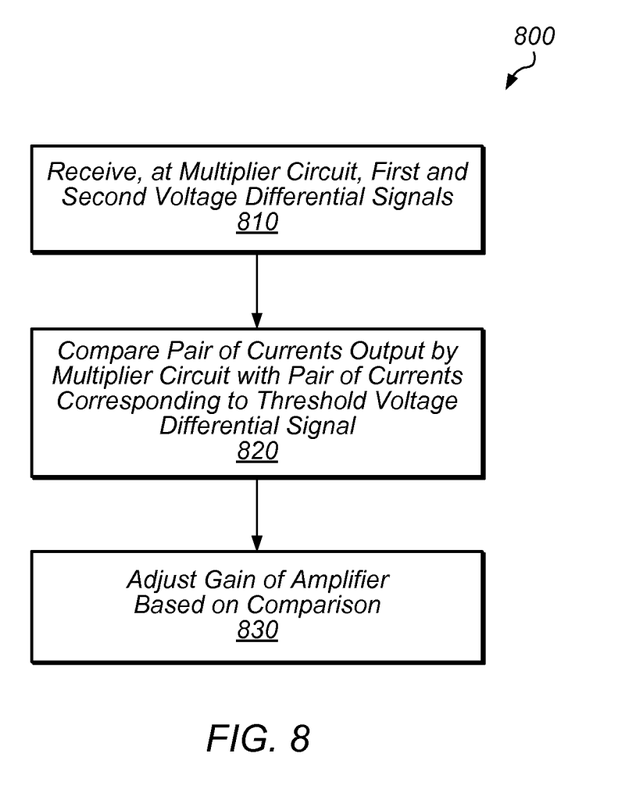
FIG. 8 is a flow diagram illustrating one embodiment of a method for performing power detection.

Turning now to FIG. 8, a flow diagram of a method 800 for performing peak power detection is depicted. Method 800 is one embodiment of a method that may be performed by an RF circuit such circuit 100. In some embodiments, performance of method 800 may permit the power detection of low-power input signals. Performance of 800 may also reduce power consumption of devices receiving such signals.

In 810, a multiplier circuit (e.g., multiplier 210A) of an RF circuit receives first and second voltage differentials signals (e.g., signals 202A and 202B) at gates of respective first and second sets of field effect transistors (FETs) (e.g., transistors 310 and 320, respectively). The multiplier circuit may then produces a first pair of currents (e.g., signal 212) and varies a difference between the pair of currents proportionally to a product of the first and second differential voltage signals. As discussed above, in one embodiment, the first and second voltage differential signals cause the FETs to operate in a linearly region of operation. In some embodiments, the RF circuit does not amplify first and second voltage differentials signals prior to the receiving.

In 820, a comparison circuit (e.g., comparison circuit 220) of the RF circuit compares a pair of currents output by the multiplier circuit with another pair of currents corresponding to a threshold voltage differential signal. In one embodiment, a second multiplier circuit (e.g., multiplier 210B) generates the other pair of currents based on a threshold differential input voltage.

In 830, the RF circuit adjusts a gain of an amplifier (e.g., amplifier 110) based on the comparison such as described above.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A power detection circuit, comprising:
    a first multiplier circuit configured to multiply a first voltage signal by a second voltage signal, wherein the first multiplier circuit is configured to receive the first voltage signal at a first transistor pair and to receive the second voltage signal at second and third transistor pairs, wherein a drain of a first transistor in the first transistor pair is coupled to sources of the second transistor pair, and wherein a drain of a second transistor in the first transistor pair is coupled to sources of the third transistor pair; and
    wherein the first multiplier circuit is configured to output a first pair of currents via first and second current mirrors, wherein the first and second current mirrors are coupled directly to the second and third transistor pairs.

2. The power detection circuit of claim 1, wherein the first current mirror is coupled directly to a drain of a transistor in the second transistor pair and a drain of a transistor in the third transistor pair, and wherein the second current mirror is coupled directly to a drain of another transistor in the second transistor pair and a drain of another transistor in the third transistor pair;
    wherein sources of the first and second transistors are coupled to a common node; and
    wherein the first, second, and third transistor pairs include field effect transistors (FETs).

3. The power detection circuit of claim 1, further comprising:
    a second multiplier circuit configured to output a second pair of currents associated with a threshold voltage signal; and
    a comparison circuit configured to compare the first pair of currents and the second pair of currents.

4. The power detection circuit of claim 1, wherein the first voltage signal is a radio frequency (RF) differential signal received along a first path including a first pair of capacitors, and wherein the second voltage signal is the radio frequency (RF) differential signal received along a second path including a second pair of capacitors; and
    wherein the power detection circuit is configured to cause the first voltage signal to have a higher direct current (DC) voltage component than the second voltage signal.

5. The power detection circuit of claim 1, wherein the first multiplier circuit is configured to receive both an RF voltage differential signal and a threshold voltage differential signal, and wherein the power detection circuit is configured to compare the RF voltage differential signal with the threshold voltage differential signal.

6. The power detection circuit of claim 5, wherein the first voltage signal includes the RF voltage differential signal, and wherein the second voltage signal includes an inverted form of the RF voltage differential signal.

7. The power detection circuit of claim 1, further comprising:
    an offset circuit configured to adjust threshold voltages of the first transistor pair by applying voltages to bodies of the first transistor pair.

8. The power detection circuit of claim 7, wherein the offset circuit includes a variable resistor, and wherein the offset circuit is configured to adjust the applied voltages by changing a resistance of the variable resistor and changing a direction of current flowing through the variable resistor.

9. The power detection circuit of claim 1, wherein the power detection circuit is configured to output a comparison indication based on a received RF signal, and wherein the power detection circuit is included within an RF circuit that is configured to adjust a gain of the RF signal based on the comparison indication.

10. The power detection circuit of claim 9, wherein the power detection circuit is not configured to preamplify the RF signal prior to being provided to the first multiplier circuit, and wherein the first multiplier circuit is configured to operate when the RF signal has a magnitude of less than 25 mV.

11. An apparatus, comprising:
a first multiplier circuit including first, second, and third field effect transistor (FET) pairs, wherein the first multiplier is configured to receive a first voltage signal at gates of the first FET pair, wherein the first multiplier circuit is configured to receive a second voltage signal at gates of the second and third FET pairs, and wherein a drain of a first transistor in the first transistor pair is coupled to sources of the second transistor pair, wherein a drain of a second transistor in the first transistor pair is coupled to sources of the third transistor pair, and wherein sources of the first and second transistors are coupled to a common node;
wherein the first multiplier circuit is configured to produce a first pair of currents via two current mirrors coupled to the second and third FET pairs; and
wherein the first multiplier circuit is configured to operate the first, second, and third FET pairs in a linear region of operation.

12. The apparatus of claim 11, further comprising:
a second multiplier circuit configured to generate a second pair of currents based on a threshold input voltage; and
a comparison circuit configured to compare the first and second pairs of currents.

13. The apparatus of claim 11, wherein the first voltage signal includes an RF signal and a threshold signal, and wherein the second voltage signal includes an inverted form of the RF signal and the threshold signal.

14. The apparatus of claim 11, further comprising:
an offset circuit configured to apply voltages to bodies of the second and third pairs of FETs to change their respective threshold voltages.

15. A method comprising:
multiplying first and second voltage differential signals received at respective gates of first and second sets of field effect transistors (FETs) of a multiplier circuit, wherein the first and second voltage differential signals cause FETs in the first and second sets of FETs to operate in a linear region of operation;
comparing a first pair of currents output by the multiplier circuit with a second pair of currents corresponding to a threshold voltage differential signal;
adjusting a gain of an amplifier based on the comparing; and
wherein the method does not include preamplifying the first and second voltage differential signals prior to the receiving, and wherein the first and second voltage differential signals have a magnitude of less than 25 mV.

16. The method of claim 15, wherein drains of FETs in the first set of FETs are coupled to sources of FETs in the second set of FETs, wherein a first FET and a second FET in the first set of FETs share a common node; and
wherein the method further comprises generating, at another multiplier circuit, the second pair of currents.

17. The method of claim 15, further comprising:
compensating for an offset produced by a mismatched pair of FETs in the first or second set of FETs, wherein the compensating includes applying a voltage to bodies of the mismatched FETs.

* * * * *